(12) United States Patent
Ahmed et al.

(10) Patent No.: US 9,865,337 B1
(45) Date of Patent: Jan. 9, 2018

(54) WRITE DATA PATH TO REDUCE CHARGE LEAKAGE OF NEGATIVE BOOST

(71) Applicant: QUALCOMM Incorporated, San Diego, CA (US)

(72) Inventors: Fahad Ahmed, San Diego, CA (US); Mukund Narasimhan, Bangalore (IN); Raghav Gupta, Bangalore (IN); Pradeep Raj, Bangalore (IN); Rahul Sahu, Bangalore (IN); Po-Hung Chen, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/466,749

(22) Filed: Mar. 22, 2017

(51) Int. Cl.
    *G11C 5/10* (2006.01)
    *G11C 11/419* (2006.01)
    *G11C 11/417* (2006.01)

(52) U.S. Cl.
    CPC .......... *G11C 11/419* (2013.01); *G11C 11/417* (2013.01)

(58) Field of Classification Search
    CPC ... G11C 11/417; G11C 11/419; G11C 7/1006; G11C 7/1075; G11C 7/12; G11C 8/16
    USPC ........................................................ 365/154
    See application file for complete search history.

(56) References Cited

U.S. PATENT DOCUMENTS

| | | |
|---|---|---|
| 8,023,351 B2 | 9/2011 | Hirabayashi |
| 8,233,342 B2 | 7/2012 | Adams et al. |
| 8,411,518 B2 | 4/2013 | Janardan et al. |
| 8,964,490 B2 | 2/2015 | Chow et al. |
| 9,437,281 B2 | 9/2016 | Hsieh et al. |
| 9,455,028 B1 | 9/2016 | Sahu |
| 9,496,027 B2 | 11/2016 | Rim et al. |
| 9,548,106 B2 | 1/2017 | Sano et al. |
| 2001/0046161 A1 | 11/2001 | Lin et al. |
| 2007/0081379 A1 | 4/2007 | Clinton et al. |
| 2012/0163110 A1 | 6/2012 | Sinha et al. |
| 2015/0131364 A1 | 5/2015 | Hsieh et al. |
| 2015/0279454 A1 | 10/2015 | Sano et al. |
| 2015/0348598 A1* | 12/2015 | Wang ............... G11C 11/417 365/72 |
| 2016/0118091 A1 | 4/2016 | Asenov et al. |

FOREIGN PATENT DOCUMENTS

JP        2009295246 A       12/2009

* cited by examiner

*Primary Examiner* — Han Yang
*Assistant Examiner* — Xiaochun L Chen
(74) *Attorney, Agent, or Firm* — Haynes and Boone, LLP (57) ABSTRACT

A write driver is provided that includes a first write driver inverter that inverts a data signal to drive a gate of a second write driver transistor. The write driver transistor has a terminal coupled to a bit line and another terminal coupled to a boost capacitor. A ground for the first write driver inverter floats during a write assist period to choke off leakage of boost charge from the boost capacitor through the write driver transistor.

20 Claims, 5 Drawing Sheets

WRITE DATA PATH TO REDUCE CHARGE LEAKAGE OF NEGATIVE BOOST

TECHNICAL FIELD

This application relates to memories, and more particularly to a memory having write driver circuitry adapted to reduce leakage of negative boost charge during a write assist period.

BACKGROUND

A static random access memory (SRAM) bitcell includes a pair of cross-coupled inverters. Depending upon the binary state of a stored data bit, a p-type metal oxide semiconductor (PMOS) transistor in one of the cross-coupled inverters may charge a true (Q) data node. Similarly, a PMOS transistor in a remaining one of the cross-coupled inverters may charge a complement (QB) data node depending the binary state of the stored data bit. The Q data node couples through a first n-type metal oxide semiconductor (NMOS) access transistor to a bit line whereas the QB data node couples through a second NMOS access transistor to a complement bit line. During a write operation in which the binary content of the bitcell is changed, one of the PMOS transistors will initially be on and charging its data node while the corresponding access transistor is attempting to discharge the same data node through the corresponding grounded bit or complement bit line. The NMOS access transistor must thus be relatively strong with regard to the PMOS transistor so that the data node can be discharged relatively quickly. To provide this strength, the NMOS access transistors may be relatively large as compared to the inverter PMOS transistors. But increasing the size of the NMOS access transistors reduces density for the resulting SRAM.

To strengthen the NMOS access transistor without such a loss in density, it is thus conventional to provide a negative boost voltage on the otherwise-grounded bit line during the write operation. This negative boost voltage applied during a write assist period increases the strength of the NMOS access transistor in comparison to the inverter PMOS transistor so that the NMOS access transistor can quickly discharge the corresponding data node yet each NMOS access transistor may remain relatively small to enhance density. The negative boost voltage is applied during the write assist period by coupling the appropriate bit line to a charged boost capacitor. But the charge on the boost capacitor is partially discharged during the write assist period through the write driver.

Figure 1:
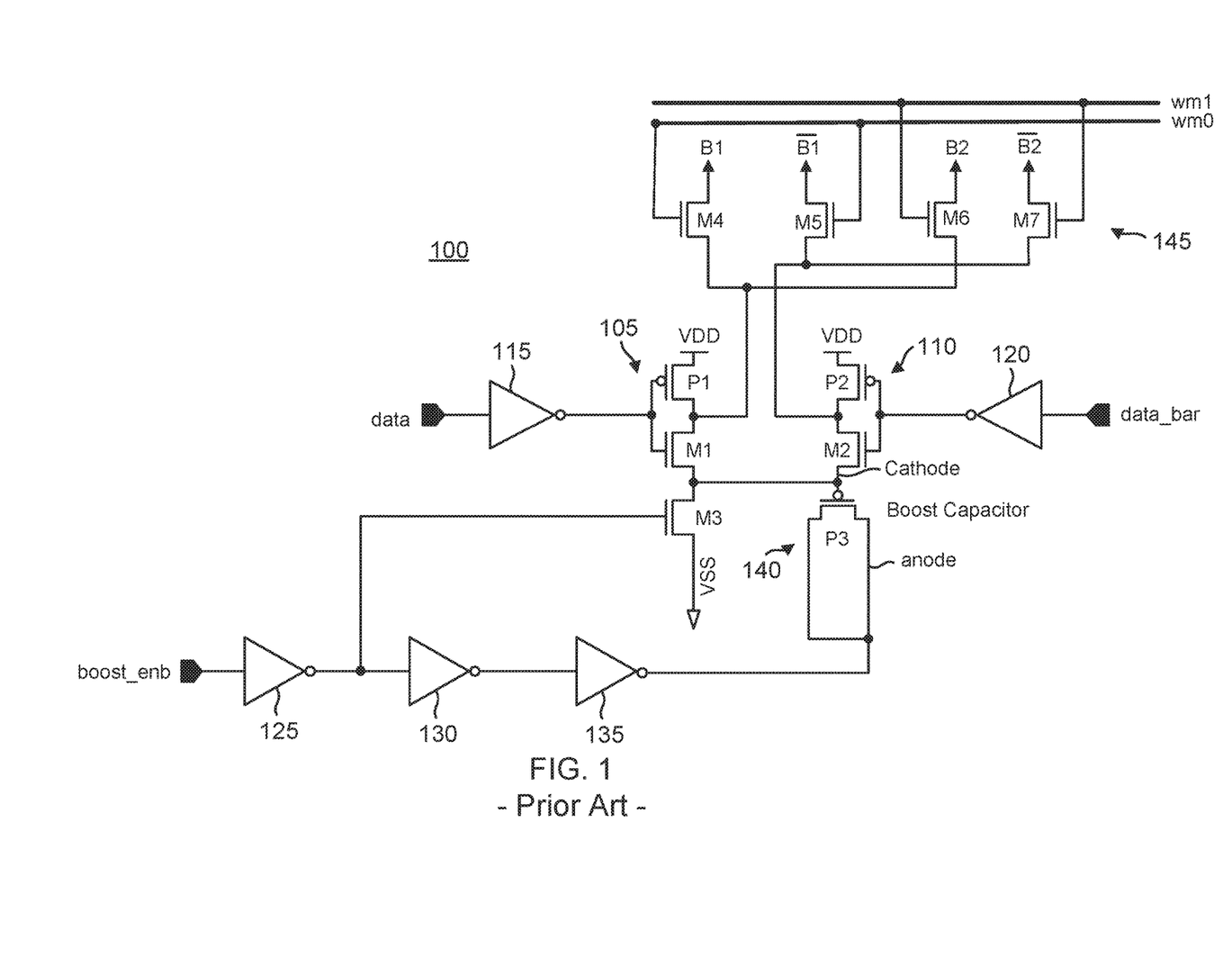
FIG. 1 is a circuit diagram of a conventional memory with negative bit line boost.

This discharge of the boost capacitor charge will now be further discussed with regard to a conventional memory 100 shown in FIG. 1. A write driver includes an inverter 115 in series with an inverter 105. An output of inverter 105 drives a true bit line selected through a column multiplexer 145 such as a true bit B1 or a true bit line B2 whereas the input data signal (data) drives an input of inverter 115. Inverter 105 includes a p-type metal oxide semiconductor (PMOS) transistor P1 having a source connected to a power supply voltage node supplying a power supply voltage VDD. A drain of transistor P1 connects to a drain of an n-type metal oxide semiconductor (NMOS) transistor M1. The drain nodes for transistors P1 and M1 (the output node for the data path through inverter 105) are coupled to column multiplexer 145. Similarly, the gates of transistors P1 and M1 from the input node for inverter 105 and are thus connected to the output of inverter 115. The source of transistor M1 connects to ground through an NMOS write assist transistor M3. An inverter 125 inverts a boost enable signal (boost_enb) to drive the gate of write assist transistor M3. In memory 100, the boost enable signal is active high such that it is a binary low value (ground) outside of the write assist period. Prior to the initiation of the write assist period, write assist transistor M3 is thus switched on. Should the input data signal have a binary high value, transistor M1 is also switched on such that the bit line is discharged to ground through transistor M1 and write assist transistor M3.

The output of inverter 125 is delayed through a pair of inverters 130 and 135 in series with inverter 125 to drive an anode of a boost capacitor 140 such as formed by the gate capacitance of a PMOS boost capacitor transistor P3 (both the drain and the source of boost capacitor transistor P3 are connected to the output of inverter 135 to form the anode of boost capacitor 140). The gate of boost capacitor transistor P3 forms the cathode of boost capacitor 140. Prior to the initiation of the write assist period, the anode of boost capacitor 140 is charged to the power supply voltage VDD whereas the cathode of boost capacitor 140 is discharged to ground. The assertion (note that as used herein, a signal is deemed to be "asserted" if it is charged high in the case of an active-high signal or discharged in the case of an active-low signal) of the boost enable signal at the initiation of the write assist period is delayed through the pair of inverters 130 and 135 to discharge the anode of boost capacitor 140. The gate capacitance for boost capacitor transistor P3 then pulls its gate voltage below ground to provide a negative write assist voltage boost to the selected bit line.

To drive a selected complementary bit line, the write driver also includes an inverter 120 in series with an inverter 110. Inverter 120 inverts a complement data bit (data_bar) to drive the input of inverter 110, which is formed by a PMOS transistor P2 in series with an NMOS transistor M2. The data path output of inverter 110 (the drains of transistors P2 and M2) drives the selected complement bit line though column multiplexer 145. When the data bit is false, the complement data bit is of course true such that transistor P2 is on and transistor M2 off prior to the write assist period. In particular, the gate of transistor M2 is grounded by the output of inverter 120 when the complement data bit is true. During the write assist period, the source voltage of transistor M2 is then pulled below ground by, for example, as much as half a volt. The gate to source voltage for transistor M2 is thus positive despite the grounding of its gate such that the boost charge from boost capacitor 140 is discharged through transistor P2 into the power supply node at its source and also into the complement bit line. An analogous discharge through transistor M1 occurs during the write assist period should the data bit input signal be a binary high value. This discharge of the boost charge not only wastes power but also weakens the negative boost for the discharged bit line.

Column multiplexer 145 suffers from an analogous discharge of the boost charge. For example, column multiplexer 145 may select for a first bit line pair (true bit line B1 and a complement bit line B1) through an NMOS column multiplexer transistor M4 and an NMOS column multiplexer transistor M5, respectively. An column multiplexer control signal wm0 controls the gates of column multiplexer transistors M4 and M5 to switch these transistors on to couple the output of write driver inverter 105 to the true bit line B1 and to couple the output of write driver inverter 110 to the complement bit line B1. Similarly, column multiplexer 145 may select for a second bit line pair (true bit line B2 and complement bit line B2) through an NMOS column multiplexer transistor M6 and an NMOS column multiplexer transistor M7, respectively. These column multiplexer transistors are switched on through the assertion of a column multiplexer control signal wm1. If the first bit line pair is selected by column multiplexer 145, column multiplexer control signal wm1 is de-asserted such that column multiplexer transistors M6 and M7 are both off. Should the data bit driving the input of write driver inverter 115 be false, transistor M1 in write driver inverter 105 will be switched on such that the negative boost from boost capacitor 140 conducts though transistor M1 during the write assist period to pull the drains of write multiplexer transistors M4 and M6 to the negative boost voltage. Although column multiplexer transistor M6 has its gate grounded, it will still be weakly on due to the positive gate-to-source voltage that it receives from the negative boost during the write assist period. Column multiplexer transistor M6 will thus leak boost charge during the write assist period into the unselected true bit line B2. More generally, a column multiplexer transistor corresponding to an unselected bit line column multiplexer 145 will leak charge in this fashion in every write assist period.

Accordingly, there is a need in the art for memories having an enhanced negative bit line boost with reduced power consumption.

SUMMARY

A write driver for a memory includes a first inverter that inverts a data signal to drive a gate of a write driver transistor such as an NMOS transistor having a drain coupled to a bit line. Depending upon a binary value for the data signal, the write driver either grounds or charges the bit line. The NMOS transistor has a source terminal connected to a cathode of a boost capacitor. During a write assist period in which a boost enable signal is asserted, the cathode of the boost capacitor is pulled to a negative boost voltage and thus also charges the source terminal of the NMOS transistor to the negative boost voltage. Should the binary state of the data signal be such that the NMOS transistor's gate is grounded prior to the write assist period, the resulting positive gate-to-source voltage for the NMOS transistor could cause it to leak the boost charge during the write assist period. To prevent this undesirable leakage of the boost charge, a switch transistor is provided that couples between ground and a ground node for the first inverter. The switch transistor is configured to switch off responsive to an assertion of the boost enable signal. The ground for the first inverter will thus float during the write assist period. The negative boost voltage at the source terminal for the NMOS transistor in the second inverter will thus pull its gate voltage negative as well due to the gate capacitance for the gate. The gate-to-source voltage for the NMOS transistor is thus prevented from going positive during the write assist period such that the NMOS transistor remains firmly off and does not leak any substantial amount of boost charge from the boost capacitor. Not only does this save power but the strength of the negative boost for the bit line is enhanced, thereby increasing the memory operation speed.

A similar floating ground may be used for the production of the column multiplexer control signals. For example, each column multiplexer control signal may be produced by a corresponding control signal inverter. A ground node for each control signal inverter couples to ground through a switch transistor that is configured to turn off responsive to the assertion of the boost enable signal. The resulting floating ground chokes off leakage of the boost charge through the inactive ones of the column multiplexer transistors that have their source terminals pulled low towards the negative boost voltage during the write assist period. In this fashion, the leakage of boost charge through the column multiplexer into the inactive bit lines is thwarted, which saves power and increases memory operating speed.

These advantage features may be better appreciated by a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A write driver for a memory is provided that may include a first pair of inverters for driving a true bit line and a second pair of inverters for driving a complement bit line. Each pair of inverters includes a first inverter that drives a second inverter. The second inverter includes an NMOS transistor having a source terminal connected to a cathode of a boost capacitor. During the write assist period, a boost enable signal is asserted that causes the boost capacitor cathode to be pulled to a negative boost voltage. Should the binary state of the data signal be such that the NMOS transistor is off prior to the write assist period, the gate voltage for the NMOS transistor is grounded. To prevent this grounded gate voltage from producing a positive gate-to-source voltage while the source terminal is pulled to the negative boost voltage during the write assist period that would result in a leakage of the negative boost charge, a ground node for the first inverter couples to ground through a switch transistor that is configured to switch off during the write assist period. The floating ground during the write assist period for the gate voltage for the NMOS transistor conserves power and speeds memory operation accordingly. The data path through the write driver is thus adapted to reduce charge leakage of the negative boost.

Figure 2A:
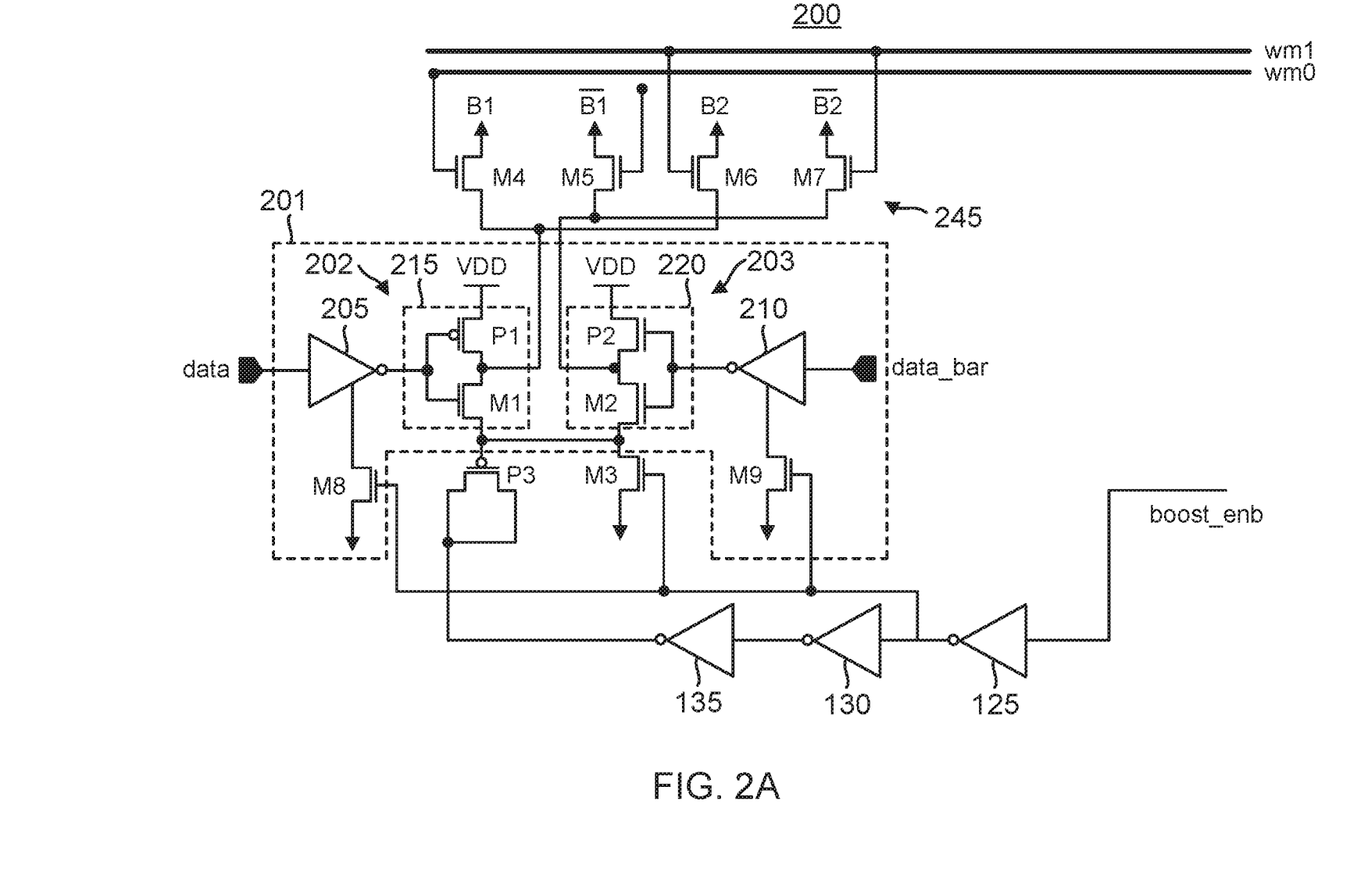
FIG. 2A is a circuit diagram of a memory write driver configured to prevent the leakage of negative boost charge in accordance with an aspect of the disclosure.

An example memory 200 including a write driver 201 and a column multiplexer 245 is shown in FIG. 2A. Memory 200 may comprise any suitable memory such as a static random access memory (SRAM). Write driver 201 includes a first pair of inverters 202 and a second pair of inverters 203. Each inverter pair includes a first inverter that drives a second inverter. In particular, inverter pair 202 includes a first inverter 205 that inverts a data signal (data) to drive the input of a second inverter 215. Similarly, inverter pair 203 includes a first inverter 210 that inverts a complement data signal (data_bar) to drive an input of a second inverter 220. Each inverter includes a serial stack of a PMOS transistor and an NMOS transistor. For example, second inverter 215 includes PMOS transistor P1 in series with NMOS transistor M1 as described with regard to memory 100. Similarly, second inverter 220 includes PMOS transistor P2 and NMOS transistor M3. As also described with regard to memory 100, the sources of transistors M1 and M2 couple to ground through a write assist transistor M3 that is controlled by an inverted version of the boost enable signal (boost_enb) as inverted by an inverter 125. The sources of transistors M1 and M2 will thus float during the write assist period while the boost enable signal is asserted. As also discussed with regard to memory 100, the boost enable signal assertion is further delayed and inverted through inverters 130 and 135 to ground the drain and source of boost capacitor transistor P3, whose gate capacitance functions as the boost capacitor. The sources of transistors M1 and M2 will thus be pulled to the negative boost voltage during the write assist period. The assertion of the boost enable signal as inverted through inverter 125 causes write assist transistor M3 to switch off so that the negative boost is not lost to ground at the sources of transistors M1 and M2. After the write assist period, write assist transistor M3 is again switched to keep these sources grounded while the drain and source of boost capacitor transistor P3 are charged to the power supply voltage VDD. It is this charging of the gate capacitance for boost capacitor transistor P3 that is then exploited during the write assist period such that the grounding of the drain and source for boost capacitor transistor P3 causes its gate voltage to be boosted to the negative boost voltage during the write assist period.

Depending upon the binary state of the input data signal (and the complement input data signal), one of transistors M1 and M2 will have its gate grounded prior to the write assist period by the corresponding first inverter 205 or 210, respectively. But ground is positive as compared to the negative boost voltage such that a positive gate-to-source voltage could be produced for the gate-grounded one of transistors M1 and M2 during the write assist period. To prevent the resulting leakage of the negative boost charge, the grounds for first inverters 205 and 210 float during the write assist period. For example, a ground node for first inverter 205 couples to ground through a switch transistor such as an NMOS switch transistor M8. This ground node is the source terminal node for the NMOS transistor (not illustrated) in first inverter 205 that is analogous to transistors M1 and M2. Similarly, a ground node for first inverter 210 couples to ground through a switch transistor such as an NMOS switch transistor M9. Like write assist transistor M3, the output of inverter 125 drives the gates of switch transistors M8 and M9. When the boost enable signal is asserted during the write assist period, switch transistors M8 and M9 are thus turned off to float the grounds for inverters 205 and 210. For example, suppose that the complement data input signal is a binary one such that the gate voltage for transistor M2 was grounded prior to the write assist period. The floating ground during the write assist period for first inverter 210 then causes the gate voltage for transistor M2 to float. Since the gate voltage is then no longer tied to ground, the gate capacitance for transistor M2 causes the gate voltage to fall in response to the negative boost voltage at the source of transistor M2. In this fashion, the conventional problem of a positive gate-to-source voltage for transistor M2 causing it to be at least partially on during the write assist period is solved. Transistor M2 is thus maintained firmly off to quash the leakage of the negative boost charge during the write assist period. An analogous operation occurs for transistor M1 when the data input signal is a binary one such that its gate voltage floats during the write assist period and is thus pulled negative in response to the negative boost voltage at the source of transistor M1. Note that in an alternative embodiment, a single switch transistor may replace switch transistors M8 and M9.

In one embodiment, such a single switch transistor (or one of switch transistors M8 and M9) may be deemed to form a means for floating a ground of a write driver inverter such as first write driver inverter 205 or 210. In addition, it will be appreciated that the floating of the gate voltage for the write driver transistor such as discussed with regard to transistors M1 and M2 does not require these transistors to be part of an inverter. There are alternative embodiments in which the write driver merely grounds one of the bit lines in a selected bit line pair but does not act to charge the remaining bit line in the bit line pair such that the charging may be accommodated by a separate circuit. Such inverterless write drivers would still suffer from the discharge of boost charge through the write driver NMOS transistor that has its source pulled to the negative boost voltage while its gate is grounded. The floating ground for an inverter driving such a write driver transistor solves these leakage problems and thus conserves power and increases operating speed.

Figure 2B:
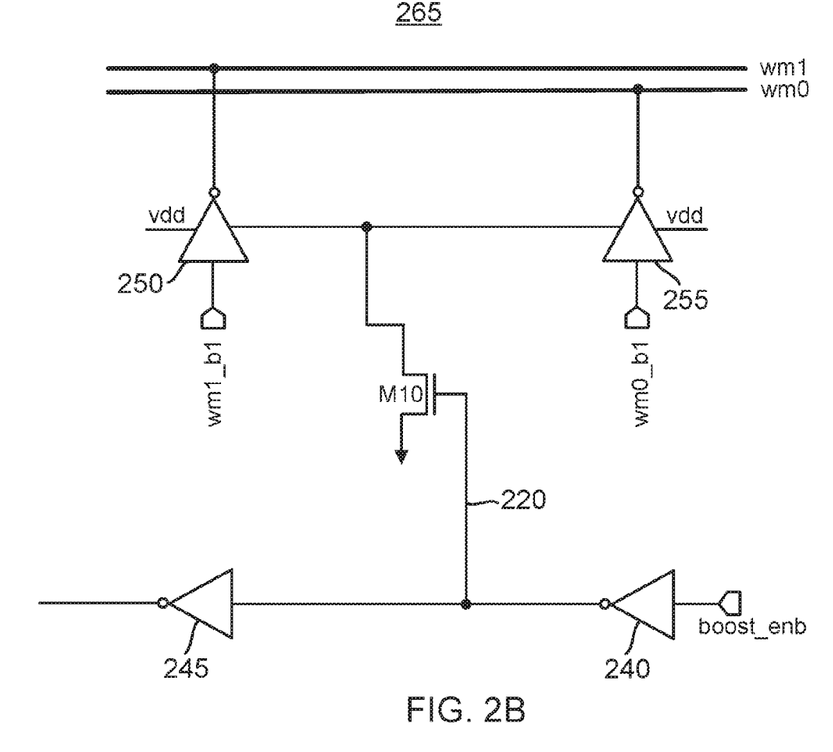
FIG. 2B is a circuit diagram of a memory column multiplexer configured to prevent the leakage of negative boost charge in accordance with an aspect of the disclosure.

Leakage through the column multiplexer transistors such as column multiplexer transistors M4, M5, M6, and M7 may be quashed in an analogous fashion as shown in FIG. 2B for a column multiplexer control signal generator 265 that produces the column multiplexer control signals such as column multiplexer control signals wm0 and wm1. A first control signal inverter 255 inverts a first input control signal wm0_b1 to produce column multiplexer control signal wm0. Similarly, a second control signal inverter 250 inverts a second input control signal wm1_b to produce column multiplexer control signal wm1. Should column multiplexer control signal wm0 be asserted, column multiplexer transistors M4 and M5 (FIG. 2A) switch on to couple the bit line B1 and the complement bit line B1 bar to the outputs of second inverter 215 and second inverter 220, respectively. Column multiplexer transistors M6 and M7 would be off during this time such that their gates are grounded. Depending upon the binary value of the data bit driving write driver 201, the source for one of column multiplexer transistors M6 and M7 will receive a negative voltage boost that can then leak due to the resulting positive gate-to-source voltage that results from the negative boost. A similar leakage can occur through one of column multiplexer transistors M4 and M5 when column multiplexer control signal wm1 is asserted to switch on column multiplexer transistors M6 and M7 to couple the bit line B2 and complement bit line B2 bar to the outputs of second inverter 215 and second inverter 220, respectively.

To prevent this undesirable leakage of the boost charge, a ground node for first control signal inverter 250 in column multiplexer control circuit 265 couples to ground through a column multiplexer switch transistor such as an NMOS column multiplexer switch transistor M10. Column multiplexer switch transistor M10 also couples between ground and a ground node for second control signal inverter 255. In an alternative embodiment, each control signal inverter 250 and 255 may be associated with its own individual switch transistor in place of column multiplexer switch transistor M10. Like switch transistors M8 and M9, column multiplexer switch transistor M10 is configured to switch off upon the assertion of the boost enable signal. For example, the boost enable signal may be inverted by an inverter 240 to drive the gate of the column multiplexer switch transistor M10. Another inverter 245 inverts the output of inverter 240 to recover the boost enable signal so that it may flow to inverter 125 of FIG. 2A. It will be appreciated, however, that the output of inverter 125 may be used in alternative embodiments to drive the gate of switch transistor M10 such that inverters 245 and 240 are optional.

During a write assist period, the grounds for control signal inverters 250 and 255 thus float. Depending upon which bit line pair is selected, one of the control signals such as wm1 and wm0 will be grounded prior to the write assist period during a write operation. That grounded control signal will then float due to the floating of the ground for the corresponding one of inverters 250 and 255. Referring again to FIG. 2A, only one of the control signals (e.g., wm0 and wm1) will be asserted whereas the other control signals will be grounded prior to the write assist period and float during the write assist period. It will be appreciated that the 2:1 column multiplexing shown may be expanded to other multiplexing factors such as a 4:1 column multiplexing. The column multiplexer transistors for the unselected bit lines that receive a negative voltage boost and also couple to the grounded control signals will then tend to leak boost charge if their gates remain grounded during the write assist period due to the resulting positive gate-to-source voltages they are exposed to. But the grounding of the corresponding inverters such as control signal inverters 250 and 255 as shown in FIG. 2B prevents this leakage because the affected column multiplexer transistors will have their floating gates pulled negative by the negative boost voltages at their source terminals. Power is thus conserved and memory operating speed enhanced accordingly.

Figure 2C:
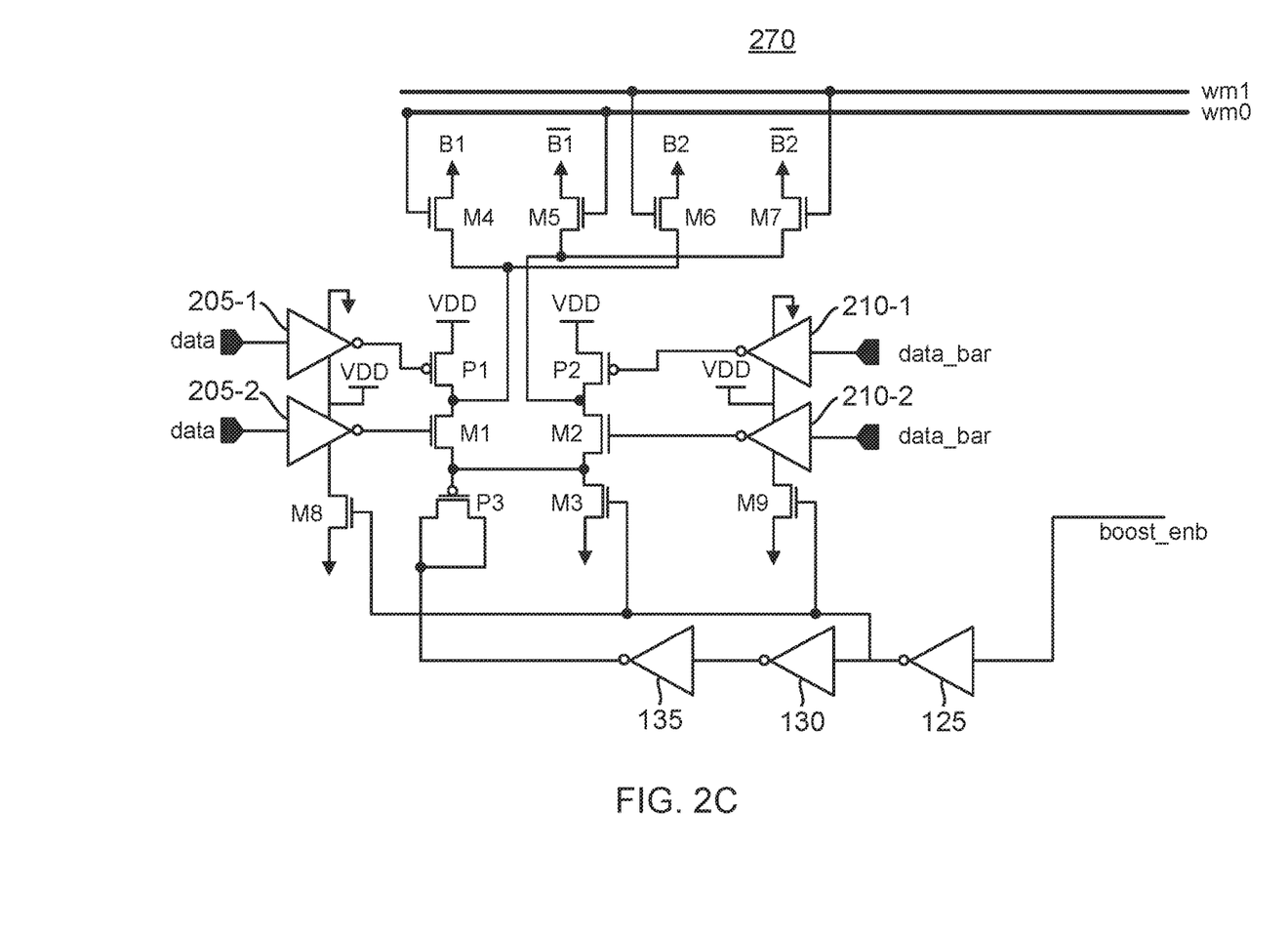
FIG. 2C is a circuit diagram of an alternative embodiment for the memory write driver of FIG. 2A in accordance with an aspect of the disclosure.

Referring again to FIG. 2A, note that first inverter 205 may be bifurcated as shown in FIG. 2C for a memory 270 such that an inverter 205-1 inverts the data input signal to drive a gate of transistor P1. There is no need to float a ground for inverter 205-1 such that its ground node is tied to ground. However, an inverter 205-2 that inverts the data input signal to drive a gate of transistor M1 has its ground node coupled to ground through switch transistor M8 as discussed with regard to inverter 205. Similarly, first inverter 210 may be replaced by a pair of inverters 210-1 and 210-2. Inverter 210-1 inverts the complement data input signal to drive a gate of transistor P2. Since there is no need to float a ground for transistor P2, the ground node for inverter 210-1 is tied to ground. In contrast, an inverter 210-2 that inverts the complement data input signal to drive a gate of transistor M2 has its ground node coupled to ground through switch transistor M9.

Figure 3:
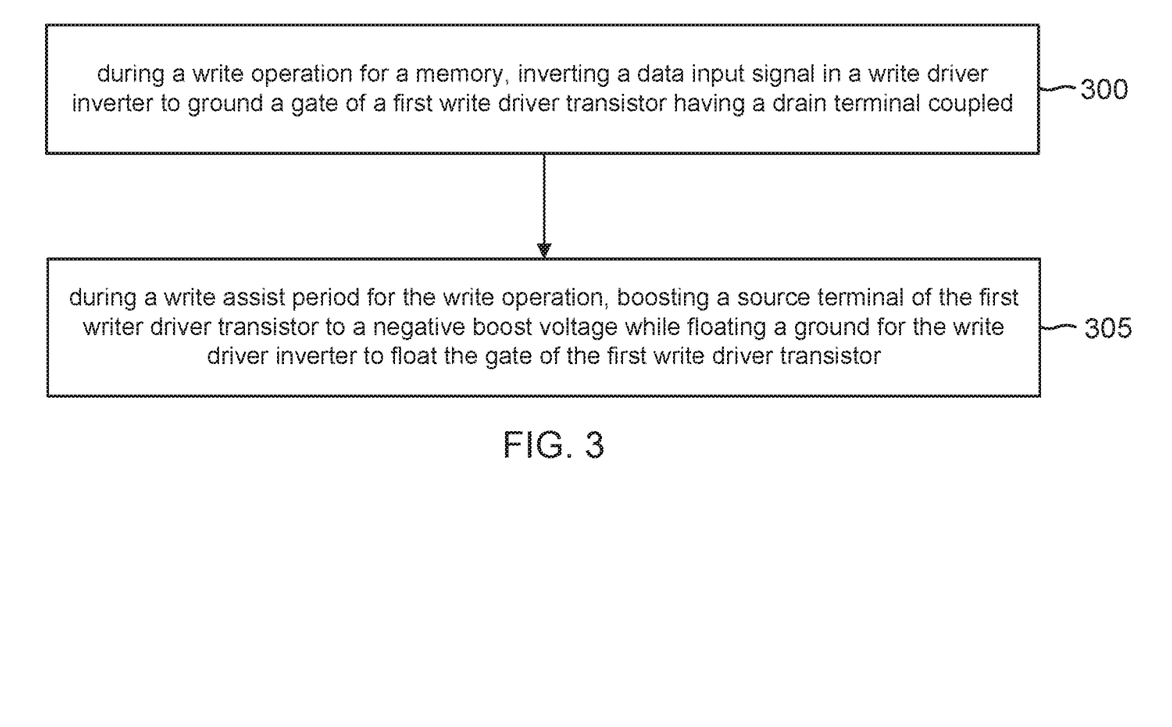
FIG. 3 is a flowchart for an example method of operation for a write driver in accordance with an aspect of the disclosure.

An example method of operation for a write driver will now be discussed with regard to the flowchart of FIG. 3. The method includes an act 300 of, during a write operation for a memory, inverting a data input signal in an inverter to ground a gate of an write driver transistor having a drain terminal coupled to a bit line. Referring again to FIG. 2A, the inverting of the data input signal (or its complement) to ground the gate of transistor M1 (or transistor M2) is an example of act 300. The method also includes an act 305 of, during a write assist period for the write operation, boosting a source terminal of the write driver transistor to a negative boost voltage while floating a ground for the inverter to float the gate of the write driver transistor. The floating of the gate voltage for transistor M1 (or for transistor M2) while its source terminal is boosted to the negative boost voltage is an example of act 305.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory comprising:
   a first write driver inverter including a first ground node;
   a switch transistor coupled between the first ground node and ground, wherein the switch transistor is configured to switch off during a write assist period to float the ground for the first write driver inverter;
   a boost capacitor; and
   a first write driver transistor having a first terminal coupled to a bit line and a second terminal connected to a terminal of the boost capacitor, wherein the first write driver inverter is configured to invert a data signal to drive a gate of the first write driver transistor.

2. The memory of claim 1, further comprising:
   a second write driver inverter including the first write driver transistor, wherein the first write driver transistor is an NMOS transistor, the first terminal is a drain terminal, and the second terminal is a source terminal.

3. The memory of claim 2, further comprising:
   a bit line pair including the bit line and a complement of the bit line;
   a third write driver inverter including a second ground node, wherein the switch transistor is also coupled between the second ground node and ground; and
   a second NMOS transistor having a drain coupled to the complement of the bit line and a source connected to the terminal of the boost capacitor, wherein the third write driver is configured to invert a complement of the data signal to drive a gate of the second NMOS transistor.

4. The memory of claim 1, further comprising:
   a first boost enable inverter for inverting a boost enable signal to drive a gate of the switch transistor.

5. The memory of claim 3, wherein the switch transistor comprises a first switch transistor coupled between the first ground node and ground and a second switch transistor coupled between the second ground node and ground.

6. The memory of claim 3, further comprising a column multiplexer configured to select for the bit line pair.

7. The memory of claim 6, further comprising a column multiplexer control signal generator including a control signal inverter for generating a column multiplexer control signal and having a third ground node, wherein the column multiplexer control signal generator further includes a column multiplexer switch transistor coupled between the third ground node and ground, and wherein the column multiplexer switch transistor is configured to switch off during the write assist period to float a ground for the control signal inverter.

8. The memory of claim 7, wherein the control signal inverter comprises a first control signal inverter including the third ground node and a second control signal inverter including a fourth ground node, and wherein the column multiplexer switch transistor comprises a first column multiplexer switch transistor coupled between the third ground node and ground and comprises a second column multiplexer switch transistor coupled between the fourth ground node and ground.

9. The memory of claim 1, wherein the memory comprises a static random access memory (SRAM).

10. The memory of claim 1, wherein the boost capacitor comprises a PMOS transistor.

11. The memory of claim 10, wherein the terminal of the boost capacitor is a gate for the PMOS transistor.

12. A method, comprising:
during a write operation for a memory, inverting a data input signal in a write driver inverter to ground a gate of a first write driver transistor having a drain terminal coupled to a bit line; and
during a write assist period for the write operation, boosting a source terminal of the first write driver transistor to a negative boost voltage while floating a ground for the write driver inverter to float the gate of the first write driver transistor.

13. The method of claim 12, further comprising:
during the write operation, inverting a complement of the data input signal to ground a gate of a second write driver transistor having a drain coupled to a complement of the bit line; and
during the write assist period for the write operation, boosting a source of the second write driver transistor to the negative boost voltage while floating the gate of the second write driver transistor.

14. The method of claim 12, further comprising:
switching off a switch transistor coupled between a ground node for the write driver inverter and ground during the write assist period to float a ground for the write driver inverter and to float the gate of the first write driver transistor.

15. The method of claim 12, further comprising:
during the write operation, inverting a first input control signal for a column multiplexer in a first control signal inverter and inverting a second input control signal for the column multiplexer in a second control signal inverter to control the column multiplexer to couple the drain terminal of the first write driver transistor to the bit line; and
during the write assist period for the write operation, floating a ground for the first control signal inverter and floating a ground for the second control signal inverter.

16. The method of claim 15, further comprising switching off a column multiplexer switch transistor to float the ground for the first control signal inverter and to float the ground for the second control signal inverter.

17. The method of claim 12, further comprising grounding an anode of a boost capacitor having a cathode connected to the source terminal of the first write driver transistor to boost the source terminal of the first write driver transistor to the negative boost voltage.

18. A memory, comprising:
a first write driver inverter;
means for floating a ground for the first write driver inverter during a write assist period;
a boost capacitor;
a boost enable inverter configured to invert a boost enable signal to ground an anode of the boost capacitor during the write assist period to provide a negative voltage boost to a cathode of the boost capacitor; and
a first write driver transistor having a first terminal coupled to a bit line and a second terminal connected to the cathode of the boost capacitor, wherein the first write driver inverter is configured to invert a data signal to drive a gate of the first write driver transistor.

19. The memory of claim 18, further comprising a second write driver inverter including the first write driver transistor, wherein the first write driver transistor is an NMOS transistor, the first terminal is a drain terminal, and the second terminal is a source terminal.

20. The memory of claim 19, further comprising a column multiplexer configured to couple the first terminal to the bit line responsive to a control signal.

* * * * *